United States Patent [19]

Huang

[11] Patent Number: 5,619,200
[45] Date of Patent: Apr. 8, 1997

[54] CODE TABLE REDUCTION APPARATUS FOR VARIABLE LENGTH DECODER

[75] Inventor: Po-Chuan Huang, Hsinchu, China

[73] Assignee: United Microelectronics Corporation, Taipei, Taiwan

[21] Appl. No.: 527,211

[22] Filed: Sep. 12, 1995

[51] Int. Cl.[6] .................................................. H03M 7/40
[52] U.S. Cl. ............................. 341/67; 341/59; 341/65; 341/106
[58] Field of Search ............................. 341/67, 59, 106, 341/65

[56] References Cited

U.S. PATENT DOCUMENTS

| | | | |
|---|---|---|---|
| 4,150,368 | 4/1979 | Chea, Jr. ................................ | 341/108 |
| 4,580,129 | 4/1986 | Bahgat .................................... | 341/67 |
| 5,032,838 | 7/1991 | Murayama et al. ................... | 341/67 |
| 5,166,684 | 11/1992 | Juri et al. .............................. | 341/67 |
| 5,479,166 | 12/1995 | Read et al. ............................ | 341/65 |

*Primary Examiner*—Howard L. Williams
*Assistant Examiner*—Thuy-Trang N. Huynh
*Attorney, Agent, or Firm*—Cushman Darby & Cushman, IP Group of Pillsbury Madison & Sutro, LLP

[57] ABSTRACT

A code table apparatus for a variable length decoder (VLD) is disclosed. The code table apparatus is connected to a barrel shifter to obtain an input code which consists of a code word portion and a sign bit. The code table apparatus comprises a coefficient table for generating a level code and a length code by the code word portion, and a mask circuit for generating a sign bit by a logic operation of the input code and the length code. The coefficient table can decode input codes with opposite sign bits, thus reducing the dimensions of the coefficient table as well as the VLD. Furthermore, since the dimensions of the coefficient table are reduced, the operation time delay of the DCT coefficient table can be shorter, thus improving the performance of the VLD.

9 Claims, 3 Drawing Sheets

CODE TABLE REDUCTION APPARATUS FOR VARIABLE LENGTH DECODER

BACKGROUND OF THE INVENTION

1. Field of the Invention

The present invention relates to video data compression systems, and more specifically, to a code table apparatus of a variable length decoder (VLD) in a video data compression system.

2. Description of the Prior Art

The main technique utilized in a data compression system is variable length coding (VLC) which transforms data into codes of variable lengths by statistical methods. That is, the data that appears more frequently is transformed into a shorter code which requires less memory capacity and shorter transmission time, thus reducing the data load of a communication medium. In order to decode or recover the codes with variable lengths into their original format, a VLD is necessary in a data compression system. Therefore, improving the operational speed of the VLD has become an important issue in high performance video systems, such as digitized high definition television (HDTV).

The variable length codes in a video system are generally generated by a discrete cosine transform (DCT). Therefore, a coefficient table called a DCT coefficient table is necessary in the VLD to recover the variable length codes into their original forms. In the past, a number of VLD structures have been disclosed, for example, U.S. Pat. Nos. 4,177,456, 5,032,838, 5,055,841, and 5,245,338. The subject matter of these U.S. Patents is incorporated herein by reference as if fully set forth herein. One of these VLD structures, illustrated in FIG. 1 (Prior Art), includes a barrel shifter 15, a DCT coefficient table 17 and a multiplexer 19. The input data of barrel shifter 15 is a data stream of successive codes with variable lengths. These codes are shifted, separated and then sequentially sent to DCT coefficient table 17 where each of the codes is decoded into a level and a length code. The level code represents the original data format and the length code stands for the length of the input code. Therefore, the length code has to be sent back to barrel shifter 15 as reference data for code shifting and separation.

Since each input code of DCT coefficient table 17 consists of a code word portion and a sign bit, DCT coefficient table 17 of a conventional VLD structure is generally separated into three portions for generating levels of positive codes, levels of negative codes and the length codes, respectively. A schematic diagram of DCT coefficient table 17 is depicted in FIG. 2. For example, DCT coefficient table 17 receives an input code "xxx . . . xs" from barrel shifter 15, wherein the front bits "xxx . . . x" are the code word portion and the last bit "s" is the sign bit. The input code "xxx . . . xs" will be directly decoded in positive level portion 11 or negative level portion 12 of DCT coefficient table 17 to generate a level code, and then output through the selection of multiplexer 19. At the same time, length code portion 13 of DCT coefficient table 17 generates a length code to barrel shifter 15 by calculating the bit number of the input code "xxx . . . xs".

Since the aforementioned VLD structure generates the level codes by two independent portions 11 and 12 in DCT coefficient table 17, the capacity of these portions must be very large when some of the codes have very long word lengths. For example, in order to satisfy the requirements of the motion picture experts group I (MPEG I) or MPEG II video standard, the VLD requires a DCT coefficient table which can decode at least 114 codes, and their code length may be as long as 17 bits. Therefore, the dimension of the VLD is dominated by DCT coefficient table 17. That is, if the VLD must be minimized so that the video system can be as compact as possible, the dimensions of DCT coefficient table should be reduced first.

On the other hand, since DCT coefficient table 17 of a convention VLD is provided by a programmable logic array (PLA), the larger the dimension of the PLA is, the longer operational time delay it will take. Since DCT coefficient table 17 requires a large capacity, the PLA dimensions are generally too large to provide high speed operation. Even though some VLD structures utilize read-only-memory devices to replace the PLA as DCT coefficient table, the vast space occupied by the ROM devices does not allow satisfactory minimization of the VLD. This means that the operating efficiency of the conventional VLD must be improved and its dimensions must be reduced by changing the decoding strategy of the DCT coefficient table.

It is also observed that positive level portion 11 and negative level portion 12 of the DCT coefficient table in the conventional VLD generate the same level code when the input codes have the same code words but different sign bits. That is, the two level portions have identical structures except for the circuit that decodes the sign bit. Obviously, the conventional VLD structure wastes a lot of space in the designation of the DCT coefficient table. Therefore, if the code word and sign bit of an input code can be processed separately, the dimensions of the DCT coefficient table for generating the level code and length code can be reduced to one half of that of a conventional VLD. This decoding strategy of the DCT coefficient table may also greatly improve the performance of the VLD.

SUMMARY OF THE INVENTION

Accordingly, the present invention provides a code table apparatus to minimize the dimensions of the DCT coefficient table as well as the VLD.

The present invention also provides a code table apparatus to improve the operating speed of the VLD when the PLA is used in DCT coefficient table.

The code table apparatus for the VLD according to the present invention is connected to a barrel shifter to obtain an input code which consists of a code word portion and a sign bit. The barrel shifter generates the input code by shifting and separating an input bit stream thereof. The code table apparatus comprises a DCT coefficient table for generating a level code and a length code by the code word portion, and a mask circuit for extracting the sign bit by logic operation of the input code and the length code. The mask circuit comprises a dual-input AND gate array and a multi-input OR gate for performing a logic operation on the input code and the length code. The DCT coefficient table decodes input codes directly using the code word portion and ignoring sign bits, thus reducing the dimensions of the DCT coefficient table as well as the VLD. Furthermore, since the dimensions of the DCT coefficient table are reduced, the operation time delay of the DCT coefficient table can be shorter, thus improving the performance of the VLD.

BRIEF DESCRIPTION OF THE DRAWINGS

Other objects, features, and advantages of the present invention will become apparent from the following detailed description of the preferred but non-limiting embodiments. The description is made with reference to the accompanying drawings in which.

DETAILED DESCRIPTION OF THE PREFERRED EMBODIMENT

In the present invention, only the code word portion of an input code from barrel shifter is decoded in the code table apparatus to generate a level code. The sign bit will be generated in a mask circuit.

Figure 1:
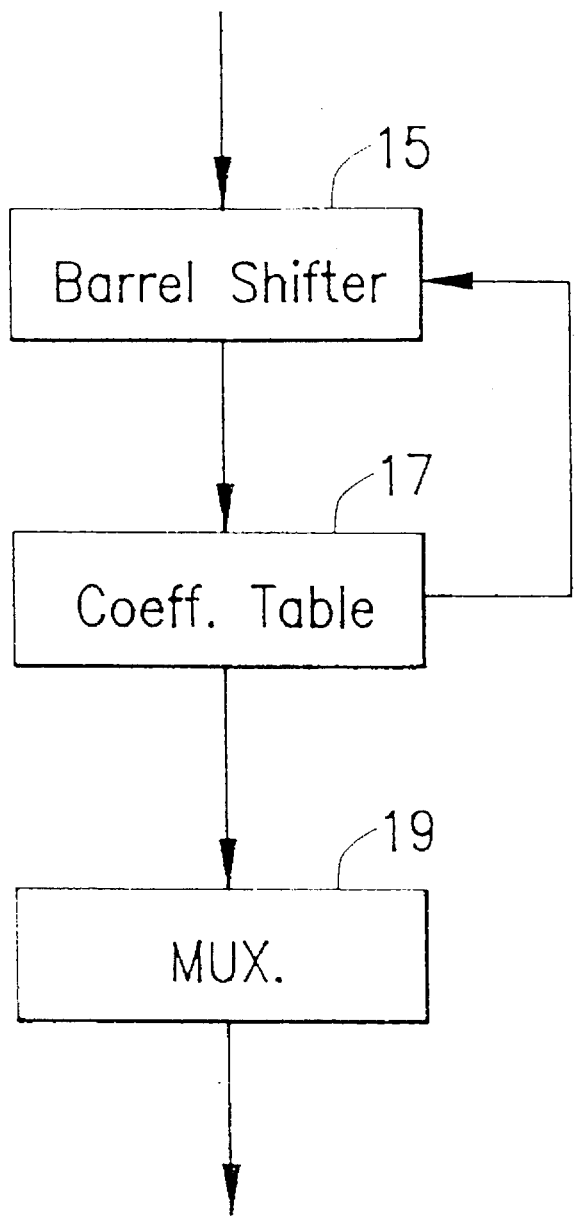
FIG. 1 (Prior Art) is a block diagram illustrating a prior art VLD structure.
Figure 2:
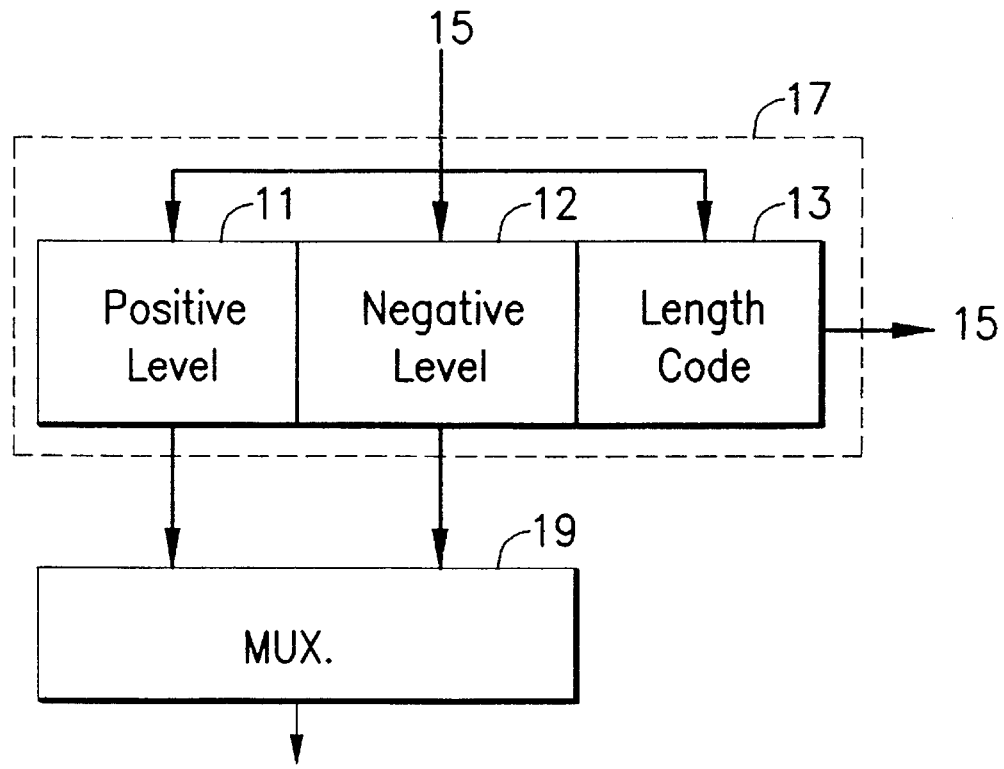
FIG. 2 is a schematic diagram illustrating the DCT coefficient table and the multiplexer in FIG. 1 (Prior Art)
Figure 3:
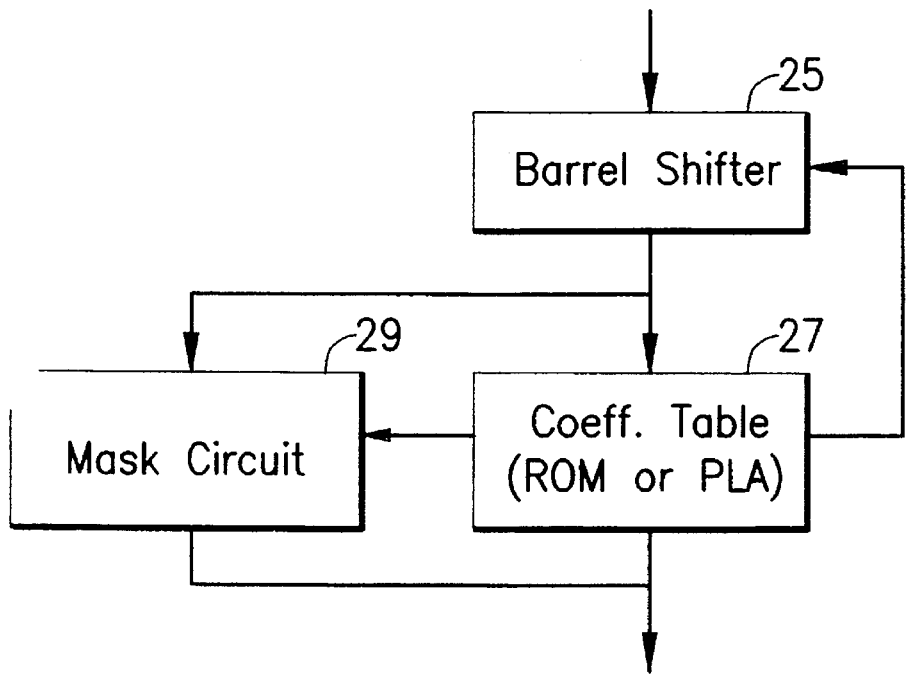
FIG. 3 is a block diagram illustrating the VLD structure according to a preferred embodiment of the present invention.

FIG. 3 is a block diagram illustrating the VLD structure according to a preferred embodiment of the present invention. Therefore, the code table apparatus of the present invention comprises a DCT coefficient table 27 and a mask circuit 29. The input data of barrel shifter 25 is a bit stream. The bit stream includes successively occurring bits of DCT results. Barrel shifter 25 shifts and separates these bits into codes with variable length, and then sends these code to DCT coefficient table 27 as input codes. The input codes, as is described in the prior art, consist each of a code word portion and a sign bit. In the present invention, the sign bit of each input code is ignored when the decoding process, which is a table-lookup process, is carried out in DCT coefficient table 27. That is, only the code word portions of the input codes are utilized in DCT coefficient table 27 for generating the level codes and the length codes. The structure of DCT coefficient table 27 is designed for both the positive and negative input codes thus avoiding the duplication of another identical level code portion in the DCT coefficient table.

Mask circuit 29 extracts the sign bits of the input codes. Mask circuit 29 has two input pores for acquiring data from barrel shifter 25 and DCT coefficient table 27. These two input ports receive the length code and the input code from DCT coefficient table 27 and barrel shifter 25, respectively. The two codes are processed by simple AND/OR logic circuit in mask circuit 29 to generate the sign bit.

Figure 4:
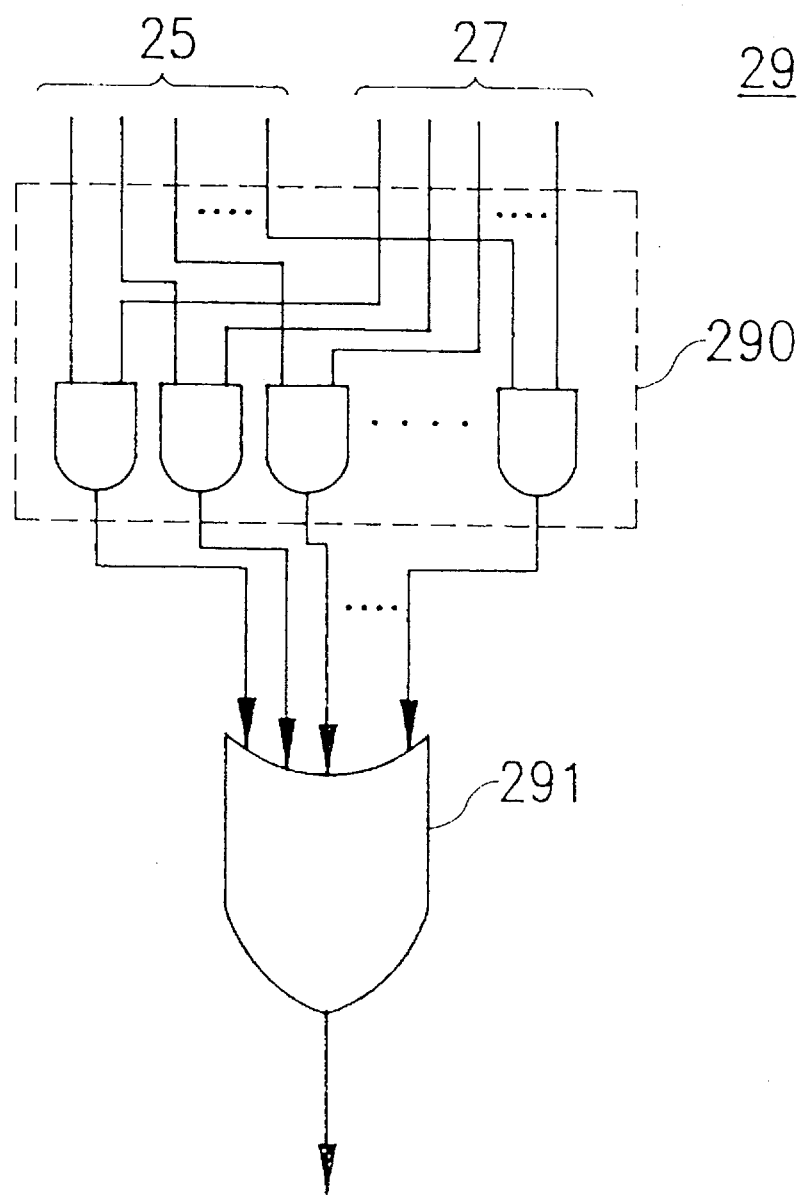
FIG. 4 is a circuit diagram illustrating the mask circuit of FIG. 3.

A preferred circuit structure of mask circuit 29 is depicted in FIG. 4, wherein a dual-input AND gate array 290 and a multi-input OR gate 291 are connected in series. In mask circuit 29, each dual-input AND gate takes a bit of input code and a bit of length code for the AND operation. All the AND operation results, i.e., all the output results of the dual-input AND gates are provided for the input of multi-input OR gate 291. Therefore, if there are n AND gates in the AND gate array 290, multi-input OR gate 291 should be provided with n input ends.

A realistic numerical example will now be shown to explain the preferred embodiment of the present invention in more detail. It is supposed that an input code "0111" is provided by barrel shifter 25 to both DCT coefficient table 27 and mask circuit 29. As is mentioned above, the least significant bit of the input code is the sign bit, i.e., s="1", therefore, the code word of the input code is "011". In the present invention, even though code "0111" is sent to DCT coefficient table 25, only the front three bits are taken into consideration in DCT coefficient table 25 to generate the level code and the length code. Then there will be the length code of "0001000 . . . 0".

The length code has all bits of "0" except the bit corresponding to the least significant bit of the input code, i.e., "1" occurs only at the fourth bit. The length code is sent to mask circuit 29 where an AND operation with the input code "0111" is carried out. For example, the first dual-input AND gate takes the first bit of input code and the first bit of length code as the two input data. Since the length code has only one bit of "1", except the fourth AND gate, all AND gates have a result of "0". As to the fourth AND gate, if the least significant bit of the input code is "1", its output will be "1", otherwise, it will be "0". Therefore, the result of OR gate 291 will be "1" if the least significant bit of input code is "1", or it will be "0". That is, the output data of OR gate 291 is the same as the sign bit of the input code.

The aforementioned DCT coefficient table can be a PLA or a ROM device. When a PLA is utilized in the present invention, since the dimensions of the DCT coefficient table are reduced to about one half of those in the prior art, the operation time delay of the PLA is greatly reduced.

What is claimed is:

1. A code table apparatus for a variable length decoder for decoding an input code including a code word portion and a sign bit, the code table apparatus comprising:

a coefficient table for generating a level code and a length code from the code word portion of the input code; and a mask circuit for extracting the sign bit by logic operations of the input code and the length code.

2. The code table apparatus of claim 1, wherein the coefficient table comprises a programmable logic array (PLA).

3. The code table apparatus of claim 1, wherein the coefficient table is a read-only-memory (ROM) device.

4. The code table apparatus of claim 1, wherein the mask circuit comprises:

a dual-input AND gate array for performing an AND-operation of the length code and the input code; and a multi-input OR gate for generating the sign bit by an OR-operation of each output bit from the dual-input AND gate.

5. The code table apparatus of claim 1, wherein the input code is provided by a barrel shifter.

6. A variable length decoder for decoding a bit stream comprising:

a barrel shifter for shifting and separating the bit stream into a plurality of input codes each consisting of a code word portion and a sign bit;

a coefficient table for generating a level code and a length code by the code word portion of each the input code; and a mask circuit for extracting the sign bit by logic operations of the input code and the length code.

7. The code table apparatus of claim 6, wherein the coefficient table is a programmable logic array (PLA).

8. The code table apparatus of claim 6, wherein the coefficient table is a read-only-memory (ROM) device.

9. The code table apparatus of claim 6, wherein the mask circuit comprises:

a dual-input AND gate array for performing an AND-operation of the length code and the input; and a multi-input OR gate for generating the sign bit by an OR-operation of each output bit from the dual-input AND gate.

* * * * *